United States Patent
Penta et al.

(10) Patent No.: US 10,822,524 B2
(45) Date of Patent: Nov. 3, 2020

(54) AQUEOUS COMPOSITIONS OF LOW DISHING SILICA PARTICLES FOR POLYSILICON POLISHING

(71) Applicant: Rohm and Haas Electronic Materials CMP Holdings, Inc., Newark, DE (US)

(72) Inventors: Naresh Kumar Penta, Newark, DE (US); Matthew Van Hanehem, Middletown, DE (US); Kwadwo E. Tettey, Newark, DE (US); Koichi Yoshida, Mie (JP); Kyohei Yoshida, Mie (JP)

(73) Assignee: ROHM AND HAAS ELECTRONIC MATERIALS CMP HOLDINGS, I, Newark, DE (US)

( * ) Notice: Subject to any disclaimer, the term of this patent is extended or adjusted under 35 U.S.C. 154(b) by 434 days.

(21) Appl. No.: 15/842,361

(22) Filed: Dec. 14, 2017

(65) Prior Publication Data

US 2019/0185714 A1  Jun. 20, 2019

(51) Int. Cl.
 *C09G 1/02* (2006.01)
 *C09K 3/14* (2006.01)
 *H01L 21/3105* (2006.01)

(52) U.S. Cl.
 CPC .............. *C09G 1/02* (2013.01); *C09K 3/1463* (2013.01); *H01L 21/31053* (2013.01)

(58) Field of Classification Search
 None
 See application file for complete search history.

(56) References Cited

U.S. PATENT DOCUMENTS

| | | | |
|---|---|---|---|
| 8,518,297 B2 | 8/2013 | Shimizu et al. | |
| 8,529,787 B2 | 9/2013 | Higuchi et al. | |
| 9,434,046 B2 | 9/2016 | Shimizu et al. | |
| 9,783,702 B1 * | 10/2017 | Guo | B24B 37/044 |
| 2007/0077764 A1 | 4/2007 | Shimizu | |
| 2009/0197414 A1 | 8/2009 | Shimizu et al. | |
| 2010/0163786 A1 * | 7/2010 | Izumi | C09K 3/1463 252/79.1 |
| 2010/0294983 A1 | 11/2010 | Matsushita et al. | |
| 2011/0121224 A1 | 5/2011 | Matsushita et al. | |
| 2011/0209413 A1 * | 9/2011 | Nishida | H01L 21/31053 51/308 |
| 2014/0094033 A1 | 4/2014 | Yamato et al. | |
| 2016/0122696 A1 * | 5/2016 | Liu | C11D 3/30 257/798 |
| 2017/0121560 A1 * | 5/2017 | Dockery | C23F 3/06 |
| 2018/0244532 A1 * | 8/2018 | Killeen | B24B 37/24 |
| 2019/0374950 A1 * | 12/2019 | Fobel | B01L 3/502792 |

FOREIGN PATENT DOCUMENTS

| | | |
|---|---|---|
| JP | 5505987 B2 | 5/2014 |
| JP | 5690609 B2 | 3/2015 |

* cited by examiner

*Primary Examiner* — Shamim Ahmed
(74) *Attorney, Agent, or Firm* — Andrew Merriam; John J. Piskorski

(57) ABSTRACT

The present invention provides aqueous chemical mechanical planarization (CMP) polishing compositions that comprise a mixture of (a) one or more alkoxylated diamines having a number average molecular weight (Mn) of from 1,000 to 20,000, or, preferably, from 1000-15000 and having four (poly)alkoxy ether groups each containing from 5 to 100 alkoxy repeat units; (b) from 0.01 to 2 wt. % or, preferably, from 0.1 to 1.5 wt. %, as solids, based on the total weight of the compositions, of one or more aqueous dispersions of elongated, bent or nodular colloidal silica particles, preferably, having a secondary particle size as determined by dynamic light scattering (DLS) of from 20 to 60 nm; and (c) ammonia or an amine base, wherein the compositions have a pH ranging from 9 to 11. The compositions are substantially free of metals, such as alkali or alkaline earth metals that can damage substrates in polishing.

10 Claims, No Drawings

AQUEOUS COMPOSITIONS OF LOW DISHING SILICA PARTICLES FOR POLYSILICON POLISHING

The present invention relates to aqueous chemical mechanical planarization (CMP) polishing compositions for use in polishing polysilicon at a high removal rate comprising a mixture of one or more alkoxylated diamines, such as ethoxylated diamine, propoxylated diamine chosen from amine or ammonium alkoxylates and at least one dispersion of colloidal silica containing elongated, bent or nodular silica particles, the compositions having a pH of from 9 to 11.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques, such as physical vapor deposition (PVD), also known as sputtering, chemical vapor deposition (CVD), or plasma-enhanced chemical vapor deposition (PECVD). As layers of the materials are sequentially deposited and removed, the uppermost surface of the wafer becomes non-planar and must be polishing to yield a flat surface before further layers can be deposited thereon. More specifically, the wafer needs to be planarized and the planarizing must stop on the underlying stop layer without resulting in any undesirable topography, such as dishing. Chemical mechanical planarization, or chemical mechanical polishing (CMP), can be used to planarize semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Recently, electronic device designs have demanded polishing compositions that provide more selectivity in CMP for polysilicon over silicon dioxide or silicon nitride stop layers, i.e., higher removal rate for polysilicon to the removal rate for silicon dioxide and/or silicon nitride. For example, such devices include advanced, sub-65 nm integrated multilevel cell and 3D-NAND flash memory devices, wherein polysilicon layers are deposited on active regions of the surface of wafers functioning as a floating gate. A floating gate is an extra control layer that stores and retrieves charge. Conventional slurries do not provide effective stopping on the oxide or nitride stop film; further, the same slurries cause a significant loss of polysilicon in the trench area or dishing. An acceptable polysilicon:oxide or nitride removal rate selectivity is necessary to prevent damage to the underlying polysilicon active areas and to provide an overpolish margin to ensure all pattern densities are cleared of the polysilicon.

U.S. patent publication no. 2010/0294983A1, to Matsushita et al. discloses a chemical mechanical polishing composition for polishing a substrate without foaming and comprising a water based liquid carrier, an abrasive, such as colloidal silica, a water soluble polymer and an alkylene diamine having two nitrogens and having at least one block polyether structure having an oxyethylene or an oxypropylene group. The compositions do not exhibit acceptable polysilicon:oxide or nitride selectivity at abrasive concentrations of 2 wt. % or less which is suitable for use in polishing polysilicon films deposited over underlying trenches.

The present inventors have endeavored to solve the problem of providing aqueous silica slurries which enable acceptable polysilicon:oxide or nitride selectivity for use in flash memory or 3D-NAND applications, as well as methods for using the slurries.

STATEMENT OF THE INVENTION

1. In accordance with the present invention, aqueous chemical mechanical planarization (CMP) polishing compositions comprising a mixture of (a) one or more alkoxylated diamines having a number average molecular weight (Mn) of from 1,000 to 20,000, or, preferably, from 1000-15000 or, more preferably, from 1,500 to 12,000, and having four (poly)alkoxy ether groups each containing from 5 to 100 or, preferably, from 10 to 40 alkoxy repeat units; (b) from 0.01 to 2 wt. % or, preferably, from 0.1 to 1.5 wt. %, as solids, based on the total weight of the compositions, of one or more aqueous dispersions of elongated, bent or nodular colloidal silica particles, for example, aqueous dispersions of particles having a secondary particle size as determined by dynamic light scattering (DLS) of from 10 to 80 nm, or, preferably, from 20 to 60 nm; and (c) ammonia or an amine base, wherein the compositions have a pH ranging from 9 to 11 or, preferably, from 10 to 11, or, more preferably, from 10 to 10.45.

2. The aqueous chemical mechanical planarization (CMP) polishing compositions as set forth in item 1, above, wherein the (a) one or more alkoxylated diamines comprises four (poly)$C_1$ to $C_4$ alkoxy ether groups.

3. The aqueous chemical mechanical planarization (CMP) polishing compositions as set forth in any one of items 1, or 2, above, wherein the (a) one or more alkoxylated diamines comprises a tetraalkoxylated $C_2$ to $C_{12}$ diamine, or, preferably, a tetraalkoxylated $C_2$ to $C_6$ diamine.

4. The aqueous chemical mechanical planarization (CMP) polishing compositions as set forth in any one of items 1, 2, or 3, above, wherein the (a) one or more alkoxylated diamines comprises an ethoxylated diamine, a propoxylated diamine or an ethoxylated and propoxylated diamine.

5. The aqueous chemical mechanical planarization (CMP) polishing compositions as in item 3, wherein the (a) one or more alkoxylated diamines comprises an ethylenediamine tetrakis(ethoxylate-block-propoxylate) tetrol.

5. The aqueous chemical mechanical planarization (CMP) polishing compositions as in any one of items 1, 2, 3 or 4, above, wherein the amount of the (a) one or more alkoxylated diamines ranges from 1 to 200 ppm, or, preferably, from 3 to 50 ppm, or, more preferably, from 3.5 to 40 ppm, as solids, based on the total weight of the composition.

6. The aqueous chemical mechanical planarization (CMP) polishing compositions as in any one of items 1, 2, 3, 4, or 5, above, wherein the (b) one or more aqueous dispersions of colloidal silica particles comprises at least 50 wt. %, as solids, or, preferably, 80 wt. % or more, as solids, of elongated, bent or nodular colloidal silica particles.

7. The aqueous chemical mechanical planarization (CMP) polishing compositions as in item 6, above, wherein the (b) one or more aqueous dispersions of colloidal silica particles comprises spherical colloidal silica particles in addition to the elongated, bent or nodular colloidal silica particles.

8. The aqueous chemical mechanical planarization (CMP) polishing compositions as in item any one of items 1, 2, 3, 4, 5, 6, or 7, above, wherein the (c) ammonia or an amine base is chosen from ammonia, alkylammonium hydroxides, $C_1$ to $C_{10}$ alkylamines, alkoxyalkyl amines, alkoxyalkyl ammonium hydroxides, $C_6$ to $C_{10}$ aryl amines or $C_6$ to $C_{10}$ aryl ammonium hydroxides, preferably, ammonia.

9. The aqueous chemical mechanical planarization (CMP) polishing compositions as in item any one of items 1, 2, 3, 4, 5, 6, 7, or 8, above, wherein the compositions are substantially free of metals, such as alkali or alkaline earth metals.

10. In accordance with a separate aspect of the present invention, a method of making an aqueous CMP polishing composition as in any one of items 1 to 9, above, comprises combining (b) one or more aqueous dispersions of elongated, bent or nodular colloidal silica particles, or, preferably, mixtures thereof with up to 50 wt. %, as solids, or, preferably, up to 20 wt. %, as solids, of colloidal silica particles, such as spherical particles; including the (a) one or more alkoxylated diamines; and then, adjusting the pH of the resulting aqueous composition with (c) an ammonia or an amine base to from 9 to 11 or, preferably, from 10 to 11 to make the aqueous CMP polishing composition.

11. The method of making an aqueous CMP polishing composition as in item 10, above, further comprising diluting the aqueous CMP polishing composition to a total silica content of from 0.1 to 2 wt. % or, preferably, from 0.1 to 1.5 wt. %, as solids, based on the total weight of the composition.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) alkoxy group" refers to an alkoxy group, such as ethoxy, polyalkoxy ethers, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "colloidally stable" means that a given composition does not gel or precipitate, and remains clear upon visible inspection after a given time and at a given temperature.

As used herein, the term "hard base" refers to metal hydroxides, including alkali(ne earth) metal hydroxides, such as NaOH, KOH, or $Ca(OH)_2$.

As used herein, the term "ISO" refers to publications of the International Organization for Standardization, Geneva, CH.

A used herein, the term "not substantially removed" means that, for silicon nitride, the amount of the material removed expressed as a thickness of that material removed is 200 Å or less, or, preferably, 150 Å or less and, that, for silicon oxide or dielectric in a trench feature, the amount of the material removed expressed as a thickness of that material removed is 250 Å or less, or, preferably, 215 Å or less.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "secondary particle size" means a secondary particle size as determined by dynamic light scattering (DLS) of an aqueous silica dispersion in which the secondary particles are not agglomerates or combined particles but represent individual elongated, bent or nodular particles.

As used herein, the term "silica particle solids" or "silica solids" means, for a given composition, the total amount of positively charged silica particles, plus the total amount of negatively charged silica particles, plus the total amount of any other silica particles, including anything with which any of those particles are treated.

As used herein, the term "solids" means any material other than water or ammonia that does not volatilize in use conditions, no matter what its physical state. Thus, liquid silanes or additives that do not volatilize in use conditions are considered "solids".

As used herein, the term "substantially free of metals" means that the total composition contains less than 30 ppm or, preferably, less than 10 ppm of any given metal.

As used herein, the term "use conditions" means the temperature and pressure at which a given composition is used, including increases in temperature and pressure during use.

As used herein, the term "weight fraction silica" means the total wt. % of silica, based on the total weight of the composition/100%. Thus, 30 wt. % silica equates to a weight fraction of 0.3.

As used herein, the term "wt. %" stands for weight percent.

The present inventors have discovered that basic slurries of aqueous elongated, bent or nodular silica particles silica particles containing alkoxylated diamines having four alkoxy chains on the diamine provide low removal rates (RR) of silicon oxide and silicon nitrides (SiN) simultaneously, while allowing for a high removal rate of polysilicon and suppressed dishing. In addition, the aqueous slurry composition in accordance with the present invention is stable against visible precipitation or sedimentation at a 15 wt. % solids content for several days. In contrast, prior known additives used to suppress polysilicon removal rates have been anionic surfactants, which are not compatible with slurries comprising cationic abrasives or low pH slurries wherein any materials are below their isoelectric points and therefore have a positive charge or a positive potential. To suppress silicon nitride and oxide removal rates simultaneously, known additives, such as polypropylene glycol or amino silane and polyacrylic acid, are not compatible with each other in colloidal stability and gel or they contradict each other in polishing performance when combined. In accordance with the present invention, alkoxylated diamines reduce dishing without significantly reducing polysilicon removal rates.

In accordance with the present invention, suitable colloidal silica compositions may comprise a dispersion of silica made by conventional sol gel polymerization or by the suspension polymerization of water glass. Such silica dispersions may take any form, such as spherical or elongated, bent or nodular silica particles.

Preferably, the silica compositions of the present invention comprise a mixture of a dispersion of spherical colloidal silica particles and a dispersion of elongated, bent or nodular silica particles.

Preferably, at least one or both of the dispersions of spherical colloidal silica particles and of the elongated, bent or nodular silica particles contains a cationic nitrogen atom within the silica particle. More preferably, the colloidal silica particle compositions of the present invention can be mixture of a dispersion of elongated, bent or nodular silica particles that contains a cationic nitrogen atom group and a dispersion of spherical colloidal silica particles.

Suitable dispersions of elongated, bent or nodular silica particles are made from suspension polymerization by hydrolytic condensation of silanols formed in a known manner from conventional precursors like tetraethoxysilane (TEOS) or tetramethoxysilane (TMOS). Processes for making the elongated, bent or nodular silica particles are known and can be found, for example, U.S. Pat. No. 8,529,787 to Higuchi et al. The hydrolytic condensation comprises reacting the precursors in aqueous suspension in the presence of a basic catalyst, such as an alkylammonium hydroxides, alkylamines, alkoxyalkyl amines, such as ethoxypropylamine (EOPA), or KOH, preferably, tetramethylammonium hydroxide; the hydrolytic condensation process may incorporate internally one or more cationic nitrogen atoms into the elongated, bent or nodular silica particles. Preferably, the elongated, bent or nodular silica particles are cationic at a pH of 4 or lower.

Spherical aqueous colloidal silica dispersions useful in mixtures of colloidal silica dispersions in accordance with the present invention may also be formed from hydrolytic condensation of conventional precursors like tetraethoxysilane (TEOS) or tetramethoxysilane (TMOS) in the presence of a basic catalyst, such as an alkylammonium hydroxides, alkylamines, alkoxyalkyl amines, such as ethoxypropylamine (EOPA), or KOH, preferably, tetramethylammonium hydroxide; the hydrolytic condensation process may incorporate one or more cationic nitrogen atoms or other cationic species into the silica particles. Spherical colloidal silica is formed in a less involved process than elongated, bent or nodular silica particles, where pH is slowly raised to form the silica particles.

Preferably, at least one cationic nitrogen atom in the dispersion of silica particles, i.e. the dispersion of elongated, bent or nodular silica particles comes from a basic catalyst, such as an alkylammonium hydroxides, alkylamines, alkoxyalkyl amines, alkoxyalkyl ammonium hydroxides, aryl amines or aryl ammonium hydroxides. Such a colloidal silica particle composition has an internal cationic nitrogen atom.

Suitable dispersions of bent or nodular silica particles are available from Fuso Chemical Co., Ltd., Osaka, JP (Fuso) under the tradenames HL-2, HL-3, HL-4, PL-2, PL-3, PL-3C or BS-2 and BS-3 slurries. The HL and BS series particles from Fuso contain one or more nitrogen atoms which impart a cationic charge at pH 4. Such nitrogen atoms are contained in alkylammonium hydroxide, alkylamine, alkoxyalkyl amine, or alkoxyalkyl ammonium hydroxide groups.

Suitable dispersions of bent or nodular silica particles that do not contain an internal nitrogen include, for example, Klebosol™ 1630 slurries (Dow Chemical Co., Midland, Mich.). The silica particle dispersions in the aqueous chemical mechanical planarization (CMP) polishing compositions of the present invention may have a z-average particle size (CPS) ranging from 10 nm to 250 nm, or, preferably, from 12 nm to 150 nm.

In accordance with the compositions of the present invention, the elongated, bent or nodular silica particles are formed without metal reactants and provide the desired substantially metal free compositions to prevent metals, which form charged particles, from penetrating any substrate.

In accordance with the present invention, suitable additives may include, for example, nonionic ethoxylated/propoxylated surfactants and polymers The aqueous chemical mechanical planarization (CMP) polishing compositions in accordance with the present invention find use in polishing polysilicon containing substrates at a high removal rate even with less than 2 wt. % of abrasive.

The CMP polishing in accordance with the present invention comprises a conventional CMP polishing method. The CMP polishing comprises: Providing a CMP polishing apparatus having a platen or table; providing the substrate to be polished, such as a polysilicon substrate which is deposited on a stop layer of a dielectric, such as silicon dioxide or silicon nitride, or, preferably, on which is deposited a layer of silicon nitride and a layer of silicon oxide; providing a CMP polishing pad, such as a polyurethane foam pad, having a polishing surface; installing onto the platen or table the CMP polishing pad; providing the aqueous CMP polishing composition of the present invention at an interface between a polishing surface of the CMP polishing pad and the substrate; and, creating dynamic contact between the CMP polishing pad surface and the substrate until the layer of polysilicon, is exposed but not substantially removed, preferably, such that the polysilicon remaining in any low areas or trenches is approximately level with the edges of any silicon oxide and/or any silicon nitride.

In accordance with the methods of the present invention, the methods comprise CMP polishing wherein the creating dynamic contact between the CMP polishing pad surface and the substrate can be by rotating the substrate, rotating the CMP polishing pad having the polishing layer, or rotating both.

In accordance with the methods of the present invention, the methods comprise: CMP polishing with a CMP polishing pad and, separately or at the same time, conditioning the polishing surface of the CMP polishing pad with a conditioning pad so that it has a surface microtexture.

In accordance with the present invention, the substrate comprises polysilicon, as well as silicon dioxide or tetraethyl orthosilicate (TEOS) and, preferably also comprises silicon nitrides, as SiN or $Si_3N_4$ or their mixtures, and the polishing results in an polysilicon:oxide or nitride removal rate ratio of at least 40:1, for example, from 50:1 to 200:1 or, preferably, from 50:1 to 100:1. The polysilicon:oxide removal rate ratio and the polysilicon:nitride removal rate ratio can be tuned, such as increased by including more of the (a) one or more alkoxylated diamines and ammonia or an amine base.

Desirably, the CMP polishing of the present invention is carried out in 3D-NAND or flash memory processing with the CMP polishing composition of the invention, preferably such that the polysilicon is adequately planarized and the silicon dioxide or silicon nitride, or both, is not substantially removed, without excessive erosion or dishing of polysilicon within the trenches or any other low areas.

EXAMPLES

The following examples illustrate the various features of the present invention.

In the Examples that follow, unless otherwise indicated, conditions of temperature and pressure are ambient temperature and standard pressure.

The following materials were used in the Examples that follow:

Slurry A: A colloidal dispersion of elongated, bent or nodular silica particles (PL-3 particles (secondary particle or non-agglomerated particle size is ~60-80 nm using DLS method) having a cationic nitrogen made from an alkoxyalkyl amine catalyst obtained as a 20 wt. % solids composition, Fuso Chemical Co., Ltd., Osaka, JP);

Slurry B: A colloidal dispersion of elongated, bent or nodular silica particles (PL-2 particles (secondary particle size is ~40-60 nm using DLS method) having a cationic nitrogen made from an alkoxyalkyl amine catalyst obtained as a 20 wt. % solids composition, Fuso Chemical Co., Ltd., Osaka, JP);

Alkoxylated diamine 1: Tetronic™ 90R4 Ethylenediamine tetrakis(ethoxylate-block-propoxylate) tetrol, wherein the ethoxylate chains have an average of 19 ethoxy units and the propoxylate chains have an average of 16 propoxy units (BASF, Ludwigshafen, DE);

The following abbreviations were used in the Examples that follow:

RR: Removal rate; PD: pattern density (% of surface area which is not a trench area).

The various silica particle compositions used in the Examples are listed in Table A, below. The silica slurry compositions in Table A, below, were adjusted to the indicated pH using the indicated titrant.

pad conditioner (Kinik Company, Taiwan), was used ex-situ at a 150N downforce for 20 sec at a table and dressing holder revolution rate, respectively, of 17/20 rpm to condition the polishing pad. The CMP polishing pad was broken in with the pad conditioner using a down force of 6.35 kg (14.0 lb) for 20 minutes and was then further conditioned prior to polishing using a down force of 4.1 kg (9 lb) for 10 minutes. The CMP polishing pad was not conditioned in situ during polishing. The pattern wafer consists of a die of 25 square segments, some having pattern densities ranging from 0% to 100%, by multiples of 10%; and others having long scale pitches ranging from 1 micron to 1000 micron (1 mm). Polysilicon thickness on pattern substrate is about 6000 Å and step height is ~1800-2000 Å. Film thickness for blanket and Pattern wafers before and after polishing were measured using a KLA-Tencor F5X metrology tool (KLA Tencor, Milpitas, Calif.). Removal rates on blanket wafers are calculated using the formula (RR=thickness removed during polishing (Å)*60/polish time (sec)). Selectivity is the RR ratio of the RR of polysilicon to the RR of TEOS film. Step height (SH) is calculated using formula (SH=(oxide+polysilicon) thickness in non trench area−(oxide+polysilicon) thickness in trench area) Results are given in Table A, above, and Tables B, C and D, below.

TABLE A

Silica Slurry Compositions

| Example | SiO$_2$ | Solids (wt. %) | Alkoxylated diamine 1 ppm | pH Titrate | Titrant (wt. %) | pH | Polysilicon RR (Å/min) | TEOS RR (Å/Min) | Polysilicon: TEOS |
|---|---|---|---|---|---|---|---|---|---|
| 1-1* | A | 1.5 | 0 | NH$_4$OH | 0.29 | 10.5 | 4000 | 42 | 97 |
| 1-2 | A | 1.5 | 3.75 | NH$_4$OH | 0.29 | 10.5 | 4278 | 62 | 69 |
| 1-3 | A | 1.5 | 3.75 | Ethanol amine | 0.3 | 10.5 | 5182 | 18 | 290 |
| 1-4 | A | 1.5 | 3.75 | Diethanol amine | 0.3 | 10.0 | 3388 | 5 | 686 |
| 1-5 | A | 1.5 | 3.75 | Dibutyl amine | 0.1 | 10.5 | 3825 | 2 | 1832 |
| 1-6 | A | 1.5 | 3.75 | Tetraethyl ammonium hydroxide | 0.09 | 10.5 | 3049 | 2 | 1601 |
| 1-7 | A | 1.5 | 3.75 | Tetrabutyl ammonium hydroxide | 0.2 | 10.5 | 1755 | 2 | 1150 |

*Denotes comparative Example.

The following test methods were used in the Examples that follow:

pH at POU: The pH at point of use (pH at POU) was that measured during removal rate testing after dilution of the indicated compositions with water to the indicated solids content.

Removal Rate and Step Height: Polishing experiments on 200 mm Blanket (polysilicon and TEOS) and pattern wafer: Polishing was performed on the substrate (PolySi MIT864, polysilicon/silicon dioxide/silicon structure) using an EPO222™ polishing machine (Ebara, Tokyo, Japan), at respective table and carrier revolution rates of 93 and 87 rpm and a downforce of 207 hPa (3 psi), and with the indicated abrasive slurry at a given flow rate of 200 ml/min. A VP5000™ polyurethane CMP polishing pad of a 74 cm (29.1") diameter and having a thickness of 2 mm (80 mil), a 10sl-P groove pattern (similar to a 1010 groove pattern) and an SP2310 subpad (specific gravity~0.965, hardness ~65 Shore D, Rohm and Haas Electronic Materials CMP Holdings, Newark, Del.). A EP1AG-150730-NC diamond

TABLE B

Step height (SH) change for 30% PD feature using various slurry compositions

| | | Example | | | |
|---|---|---|---|---|---|
| | | 1-1* | 1-2 | 1-3 | 1-5 |
| Performance Parameter | | SH, Å | SH, Å | SH, Å | SH, Å |
| Polish Time, sec | 0 | 1841 | 1908 | 1852 | 1841 |
| | 18 | 681 | | | |
| | 20 | | | 497 | 1628 |
| | 25 | | 493 | | |
| | 36 | 280 | | 462 | |
| | 40 | | 505 | | 1526 |
| | 50 | | 524 | 977 | |
| | 54 | 833 | | | |
| | 60 | | 557 | 1008 | 296 |

TABLE B-continued

Step height (SH) change for 30% PD feature using various slurry compositions

| | Example | | | |
|---|---|---|---|---|
| | 1-1* | 1-2 | 1-3 | 1-5 |
| 72 | 1007 | | | |
| 75 | | 640 | | |
| 80 | | | | 494 |
| 100 | | | | 1760 |

*Denotes comparative Example.

As shown in Table B, above, and in Tables C and D, below, the composition of inventive Example 1-2 shows the lowest step height at the end of polishing, evidencing the higher polysilicon removal rate and reduced polysilicon dishing. Comparative Example 1-1 exhibited dishing, wherein step height initially decreases as the surface is planarized and then increases once the underlying stop layer is exposed and removal of polysilicon continues in the trench of the substrate. In Example 1-5, use of a non-preferred base, leads to lessened control over dishing. The results in Tables C and D, below, are more pattern intensive, whereby dishing is harder to avoid and the non-preferred base leads to reduced dishing control.

TABLE C

Step height (SH) change for 50% PD feature using various slurry compositions

| | | Example | | | |
|---|---|---|---|---|---|
| | | 1-1* | 1-2 | 1-3 | 1-5 |
| Performance Parameter | | SH, Å | SH, Å | SH, Å | SH, Å |
| Polish Time, sec | 0 | 1825 | 1895 | 1835 | 1853 |
| | 18 | 654 | | | |
| | 20 | | | 504 | 1617 |
| | 25 | | 465 | | |
| | 36 | 247 | | 483 | |
| | 40 | | 374 | | 1627 |
| | 50 | | 510 | 854 | |

TABLE C-continued

Step height (SH) change for 50% PD feature using various slurry compositions

| | Example | | | |
|---|---|---|---|---|
| | 1-1* | 1-2 | 1-3 | 1-5 |
| 54 | 734 | | | |
| 60 | | 539 | 883 | 272 |
| 72 | 878 | | | |
| 75 | | 594 | | |
| 80 | | | | 839 |
| 100 | | | | 1871 |

*Denotes comparative Example.

The inventive formulations containing the alkoxylated diamines and ammonia even at 3.75 ppm give improved dishing control.

TABLE D

Step height (SH) change for 70% PD feature using various slurry composition

| | | Example | | | |
|---|---|---|---|---|---|
| | | 1-1* | 1-2 | 1-3 | 1-5 |
| Performance Parameter | | SH, Å | SH, Å | SH, Å | SH, Å |
| Polish Time, sec | 0 | 1835 | 1891 | 1829 | 1842 |
| | 18 | 740 | | | |
| | 20 | | | 534 | 1672 |
| | 25 | | 572 | | |
| | 36 | 299 | | 220 | |
| | 40 | | 373 | | 782 |
| | 50 | | 382 | 475 | |
| | 54 | 526 | | | |
| | 60 | | 400 | 493 | 365 |
| | 72 | 612 | | | |
| | 75 | | 438 | | |
| | 80 | | | | 422 |
| | 100 | | | | 1366 |

*Denotes comparative Example.

Additional polishing was performed, as above, with the indicated slurries as shown in Table E, below. Step Height analyses were conducted and are shown in Table F, below.

TABLE E

Slurry Compositions with Increasing Alkoxylated Diamine Concentration And Blanket Wafer Polishing Performance

| Example | SiO₂ | Solids (wt. %) | Alkoxylated diamine 1 ppm | NH₄OH (wt. %) | pH | Polysilicon RR (Å/Min) | TEOS RR (Å/Min) | polysilicon:TEOS |
|---|---|---|---|---|---|---|---|---|
| 2-1 | A | 1.5 | 3.75 | 0.3 | 10.5 | 5,034 | 70 | 72 |
| 2-2 | A | 1.5 | 7.5 | 0.3 | 10.5 | 4,754 | 67 | 71 |
| 2-3 | A | 1.5 | 15 | 0.3 | 10.5 | 4,305 | 62 | 69 |
| 2-4 | A | 1.5 | 37.5 | 0.3 | 10.5 | 1,990 | 52 | 38 |

As shown in Table F, below, increasing alkoxylated diamine concentration up to at least 15 ppm decreases final step height. As shown in Table E, above, increasing alkoxylated diamine concentration decreases polysilicon:oxide selectivity.

TABLE F

Step Height Change For 50% PD Feature Using Various Slurry Compositions

| | Example | | |
|---|---|---|---|
| | 2-1 | 2-2 | 2-3 |
| Performance Parameter | SH, Å | SH, Å | SH, Å |
| Polish Time, sec 0 | 1849 | 1838 | 1918 |
| 15 | 605 | 756 | 447 |
| 30 | 286 | 241 | 215 |
| 45 | 188 | 391 | 119 |
| 60 | 418 | 451 | 199 |
| 75 | 478 | 385 | 250 |

As shown in Table G, below, increasing the solids concentration of the polishing compositions decreases their selectivity for polysilicon over oxide removal rate. Preferably, such selectivity is >50. Accordingly, the compositions of the present invention have a low solids content in use, which may be achieved by dilution at the point of use.

TABLE G

Effect of solids % on RRs and selectivity

| Example | SiO$_2$ | Solids (wt. %) | Alkoxylated diamine 1 ppm | NH$_4$OH (wt. %) | Polysilicon RRs (Å/Min) | TEOS RR (Å/Min) | polysilicon:TEOS |
|---|---|---|---|---|---|---|---|
| 3-1 | A | 0.75 | 3.75 | 0.15 | 3090 | 14 | 215 |
| 3-2 | A | 1.50 | 7.5 | 0.3 | 4893 | 58 | 84 |
| 3-3 | A | 3.00 | 15 | 0.6 | 7147 | 165 | 43 |
| 3-4 | A | 7.50 | 37.5 | 1.5 | 7575 | 533 | 14 |
| 3-5 | A | 15.00 | 75 | 3.0 | 4272 | 1206 | 4 |

As shown in Table H, below decreasing the ammonia concentration in compositions of the present invention decreases pH and may decrease polysilicon RR but increased their selectivity.

TABLE H

Effect of ammonia concentration on RRs and selectivity

| Example | SiO$_2$ | Solids (wt. %) | Alkoxylated diamine 1 ppm | NH$_4$OH (wt. %) | pH | Polysilicon RRs (Å/Min) | TEOS RR (Å/Min) | Polysilicon:TEOS |
|---|---|---|---|---|---|---|---|---|
| 4-1 | A | 1.5 | 7.5 | 0.3 | 10.5 | 4723 | 62 | 76 |
| 4-2 | A | 1.5 | 7.5 | 0.15 | 10.4 | 3631 | 42 | 86 |
| 4-3 | A | 1.5 | 7.5 | 0.05 | 10.1 | 2393 | 4 | 648 |

As shown in Table I, below, a smaller particle size slurry B may decrease polysilicon RRs but increased their selectivity.

TABLE I

Effect of particle size on RRs and selectivity

| Example | SiO$_2$ | Solids (wt. %) | Alkoxylated diamine 1 ppm | NH$_4$OH (wt. %) | pH | Polysilicon RRs (Å/Min) | TEOS RR (Å/Min) | Polysilicon:TEOS |
|---|---|---|---|---|---|---|---|---|
| 5-1 | A | 1.5 | 7.5 | 0.3 | 10.5 | 4723 | 62 | 76 |
| 5-2 | B | 1.5 | 7.5 | 0.3 | 10.5 | 4124 | 48 | 85 |

We claim:

1. An aqueous chemical mechanical planarization (CMP) polishing composition consisting of water, a mixture of (a) one or more alkoxylated diamines having a number average molecular weight (Mn) of from 1,000 to 20,000 and having four (poly)alkoxy ether groups each containing from 5 to 100 alkoxy repeat units; (b) from 0.01 to 2 wt. %, as solids, based on the total weight of the compositions, of one or more aqueous dispersions of elongated, bent or nodular colloidal silica particles, and (c) ammonia or an amine base, wherein the compositions have a pH ranging from 9 to 11.

2. The aqueous chemical mechanical planarization (CMP) polishing composition as claimed in claim 1, wherein the (a) one or more alkoxylated diamines comprises four (poly)$C_1$ to $C_4$ alkoxy ether groups.

3. The aqueous chemical mechanical planarization (CMP) polishing composition as claimed in claim 1, wherein the (a) one or more alkoxylated diamines comprises a tetraalkoxylated $C_2$ to $C_{12}$ diamine.

4. The aqueous chemical mechanical planarization (CMP) polishing composition as claimed in claim 1, wherein the (a) one or more alkoxylated diamines comprises an ethoxylated diamine, a propoxylated diamine or an ethoxylated and propoxylated diamine.

5. The aqueous chemical mechanical planarization (CMP) polishing composition as claimed in claim 4, wherein the (a) one or more alkoxylated diamines comprises an ethylenediamine tetrakis(ethoxylate-block-propoxylate) tetrol.

6. The aqueous chemical mechanical planarization (CMP) polishing composition as claimed in claim 1, wherein the amount of the (a) one or more alkoxylated diamines ranges from 1 to 200 ppm, as solids, based on the total weight of the composition.

7. The aqueous chemical mechanical planarization (CMP) polishing composition as claimed in claim 1 wherein (b) is from 0.01 to 2 wt. %, as solids, based on the total weight of the compositions, of one or more aqueous dispersions of elongated, bent or nodular colloidal silica particles having a secondary particle size as determined by dynamic light scattering (DLS) of from 20 to 60 nm.

8. The aqueous chemical mechanical planarization (CMP) polishing composition as claimed in claim 1, (b) is from 0.1 to 1.5 wt. %, as solids, based on the total weight of the compositions, of one or more aqueous dispersions of elongated, bent or nodular colloidal silica particles.

9. The aqueous chemical mechanical planarization (CMP) polishing composition as claimed in claim 8, wherein the (b) one or more aqueous dispersions of colloidal silica particles comprises at least 50 wt. %, as solids, of elongated, bent or nodular colloidal silica particles.

10. The aqueous chemical mechanical planarization (CMP) polishing composition as claimed in claim 1, wherein the (c) ammonia or an amine base is chosen from ammonia, alkylammonium hydroxides, C1 to C10 alkylamines, alkoxyalkyl amines, alkoxyalkyl ammonium hydroxides, C6 to C10 aryl amines or C6 to C10 aryl ammonium hydroxides.

* * * * *